United States Patent
Lin

(10) Patent No.: US 10,824,205 B2
(45) Date of Patent: Nov. 3, 2020

(54) ELECTRONIC DEVICE

(71) Applicant: Che-Hsien Lin, Taipei (TW)

(72) Inventor: Che-Hsien Lin, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/445,250

(22) Filed: Jun. 19, 2019

(65) Prior Publication Data

US 2019/0391619 A1    Dec. 26, 2019

Related U.S. Application Data

(60) Provisional application No. 62/688,368, filed on Jun. 21, 2018.

(51) Int. Cl.
*G06F 1/16* (2006.01)
*G06F 1/20* (2006.01)
*H05K 5/02* (2006.01)

(52) U.S. Cl.
CPC .......... *G06F 1/1681* (2013.01); *G06F 1/1618* (2013.01); *G06F 1/203* (2013.01); *H05K 5/0226* (2013.01)

(58) Field of Classification Search
CPC ...... G06F 1/1681; G06F 1/1618; G06F 1/203; H05K 5/0226
See application file for complete search history.

(56) References Cited

U.S. PATENT DOCUMENTS

| 2013/0170122 A1* | 7/2013 | Lai | G06F 1/16 361/679.6 |
| 2015/0020351 A1* | 1/2015 | Lin | E05D 11/06 16/366 |
| 2019/0278345 A1* | 9/2019 | Ye | G06F 1/1656 |

FOREIGN PATENT DOCUMENTS

| TW | I547235 | 8/2016 | |
| TW | 201722249 | 6/2017 | |
| TW | 201722249 A * | 6/2017 | ............... G06F 1/20 |

OTHER PUBLICATIONS

"Office Action of Taiwan Counterpart Application", dated Apr. 22, 2020, p. 1-p. 5.

* cited by examiner

*Primary Examiner* — Hoa C Nguyen
*Assistant Examiner* — Keith DePew
(74) *Attorney, Agent, or Firm* — JCIPRNET

(57) ABSTRACT

An electronic device includes a first body, a second body, a hinge module and a linkage mechanism. The second body includes a main body portion and a back cover movably disposed to the main body portion. The hinge module is pivoted between the first body and the second body. The linkage mechanism is disposed in the second body, and is connected to the hinge module. The back cover is fixed to the linkage mechanism. The linkage mechanism is changed between a first state and a second state. When the linkage mechanism is in the first state, there is a first space between the back cover and the hinge module. When the linkage mechanism is in the second state, there is a second space between the back cover and the hinge module. The second space is larger than the first space.

10 Claims, 10 Drawing Sheets

ELECTRONIC DEVICE

CROSS-REFERENCE TO RELATED APPLICATION

This application claims the priority benefit of U.S. provisional application Ser. No. 62/688,368, filed on Jun. 21, 2018. The entirety of the above-mentioned patent application is hereby incorporated by reference herein and made a part of this specification.

BACKGROUND

Technical Field

The present disclosure relates to an electronic device, and more particularly to an electronic device capable of improving heat dissipation effect.

Description of Related Art

With the advancement of technology, the performance of notebook computers is significantly improved. In the meantime, the heat generated by the notebook computer is getting more and more, and the existing heat dissipation method is no longer useful. Therefore, how to improve the heat dissipation efficiency of notebook computers is an important technical issue in this field.

SUMMARY

The present disclosure provides an electronic device capable of solving the problem of low heat dissipation effect of the existing electronic device.

An electronic device of the present disclosure includes a first body, a second body, a hinge module and a linkage mechanism. The second body includes a main body portion and a back cover movably disposed to the main body portion. The hinge module is pivoted between the first body and the second body. The linkage mechanism is disposed in the second body, and is connected to the hinge module. The back cover is fixed to the linkage mechanism. The linkage mechanism is changed between a first state and a second state. When the linkage mechanism is in the first state, there is a first space between the back cover and the hinge module. When the linkage mechanism is in the second state, there is a second space between the back cover and the hinge module, and the second space is larger than the first space.

In an embodiment of the disclosure, the linkage mechanism includes a fixing member, a first connecting rod, a second connecting rod and a linking member. The fixing member is connected to the hinge module. The first connecting rod is pivoted to the fixing member. The second connecting rod is slidably disposed to the fixing member, and pivoted to the first connecting rod. The linking member is slidably disposed to the second connecting rod, and the back cover is fixed to the linking member.

In an embodiment of the disclosure, the fixing member has a first pivot hole and a first sliding slot. The first connecting rod has a second pivot hole and a third pivot hole. The second pivot hole and the third pivot hole are respectively located at opposite ends of the first connecting rod. The second connecting rod has a fourth pivot hole, a fifth pivot hole and a sixth pivot hole. The fifth pivot hole and the sixth pivot hole are respectively located at opposite ends of the second connecting rod, and the fourth pivot hole is located between the fifth pivot hole and the sixth pivot hole. The linking member has a second sliding slot. The linkage mechanism includes a first shaft member, a second shaft member, a third shaft member and a fourth shaft member. The first shaft member is disposed through the first pivot hole and the second pivot hole to pivot the first connecting rod to the fixing member. The second shaft member is disposed through the third pivot hole and the fourth pivot hole to pivot the second connecting rod to the first connecting rod. The third shaft member is disposed through the fifth pivot hole and the first sliding slot, so that the second connecting rod is slidably disposed to the fixing member. The fourth shaft member is disposed through the sixth pivot hole and the second sliding slot, so that the second connecting rod is slidably disposed to the linking member.

In an embodiment of the disclosure, the first sliding slot has a first end and a second end opposite to the first end. When the linkage mechanism is in the first state, the third shaft member abuts against the first end. When the linkage mechanism is in the second state, the third shaft member abuts against the second end.

In an embodiment of the disclosure, the third shaft member includes a force receiving portion. The force receiving portion is adapted to be subjected to force to drive the third shaft member to slide in a first direction in the first sliding slot, and is adapted to drive the fourth shaft member to slide in a second direction opposite to the first direction in the second sliding slot, so that the second connecting rod drives the back cover to move in a third direction perpendicular to the first direction.

In an embodiment of the disclosure, the linkage mechanism is in the second state. When the back cover is subjected to a force in a fourth direction opposite to the third direction, the third shaft member abuts against the second end, so that the linkage mechanism is in the second state.

In an embodiment of the disclosure, the linkage mechanism further includes an elastic member, a first engaging member and a second engaging member. The elastic member is disposed between the first shaft member and the third shaft member, and configured to pull the third shaft member to move in the first direction to switch the linkage mechanism to the second state. The first engaging member is connected to the third shaft member. The second engaging member is configured to engage the first engaging member to bring the linkage mechanism into the first state.

In an embodiment of the disclosure, the linkage mechanism is in the second state. When the back cover is subjected to a force in a fourth direction opposite to the third direction, the third shaft member abuts against the second end, so that the linkage mechanism is in the second state. The linkage mechanism further includes an actuating member. The actuating member is slidably disposed to the first shaft member, and configured to switch the linkage mechanism to a third state. When the back cover is subjected to the force in the fourth direction, the third shaft member slides in the first sliding slot to switch the linkage mechanism from the third state to the first state.

In an embodiment of the disclosure, the linkage mechanism is in the second state, when the back cover is subjected to a force in the fourth direction opposite to the third direction, the third shaft member slides in the first sliding slot to switch the linkage mechanism from the second state to the first state.

In an embodiment of the disclosure, the hinge module includes a first bracket and a second bracket. The first bracket is fixed to the first body. The second bracket is fixed to the second body, and pivoted to the first bracket to pivot the second body to the first body.

Based on the above, the electronic device of the present disclosure makes it possible to improve the heat dissipation efficiency.

In order to make the aforementioned features and advantages of the disclosure more comprehensible, embodiments accompanying figures are described in detail below.

DESCRIPTION OF THE EMBODIMENTS

Figure 1:
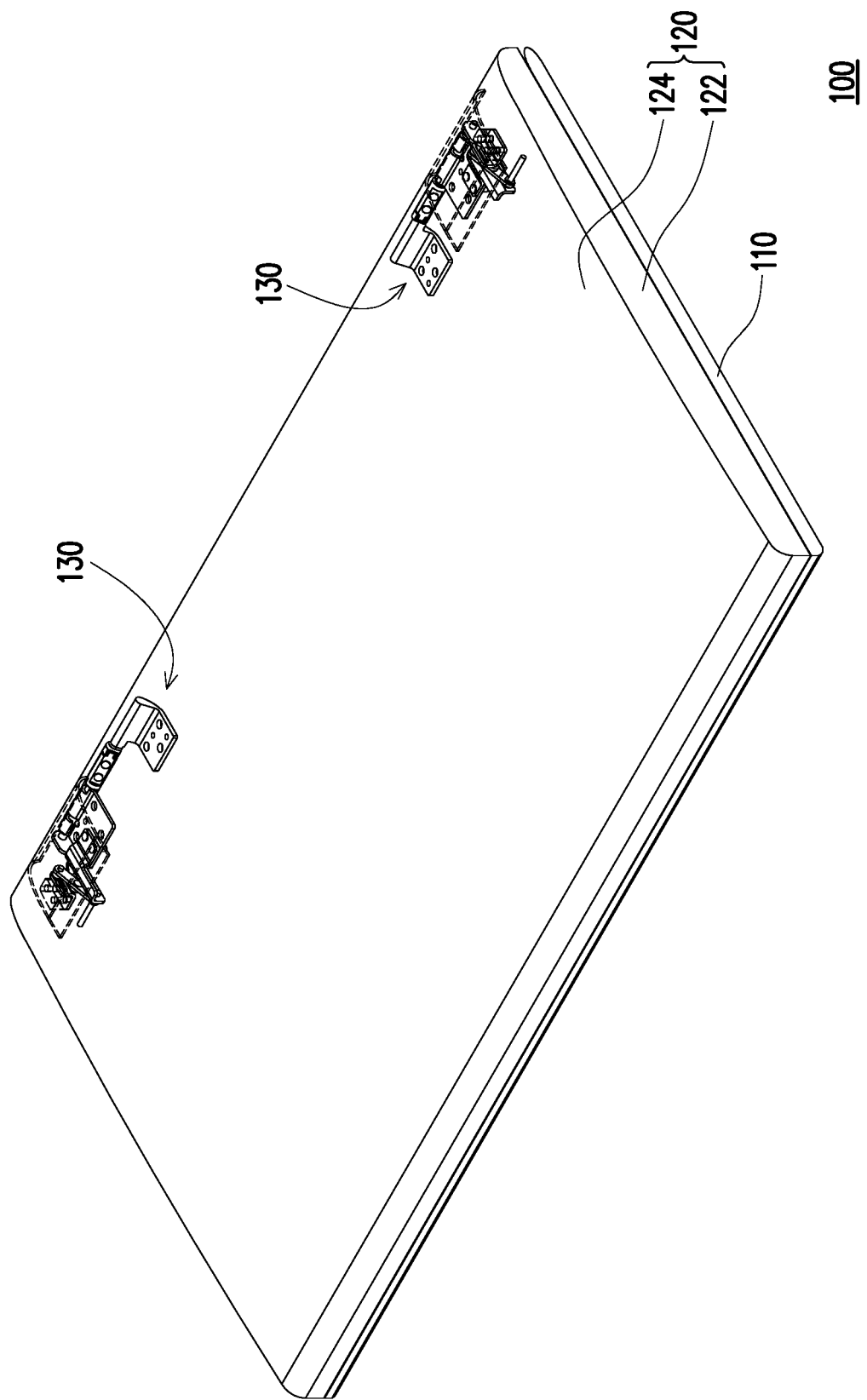
FIG. 1 is a schematic perspective view of an electronic device according to a first embodiment of the present disclosure.
Figure 2A:
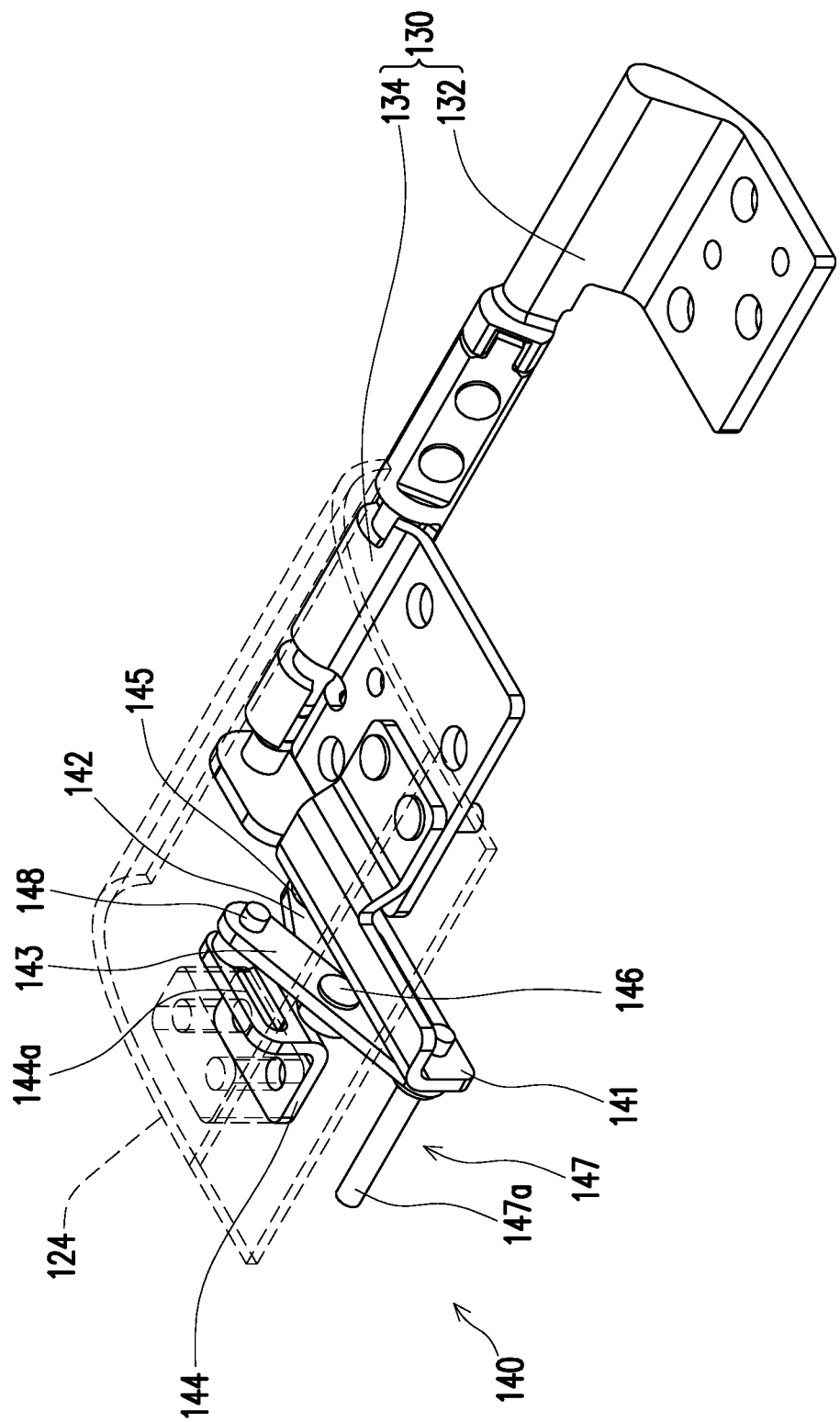
FIG. 2A is a schematic partial perspective view of the electronic device of FIG. 1 omitting a part of the components.
Figure 2B:
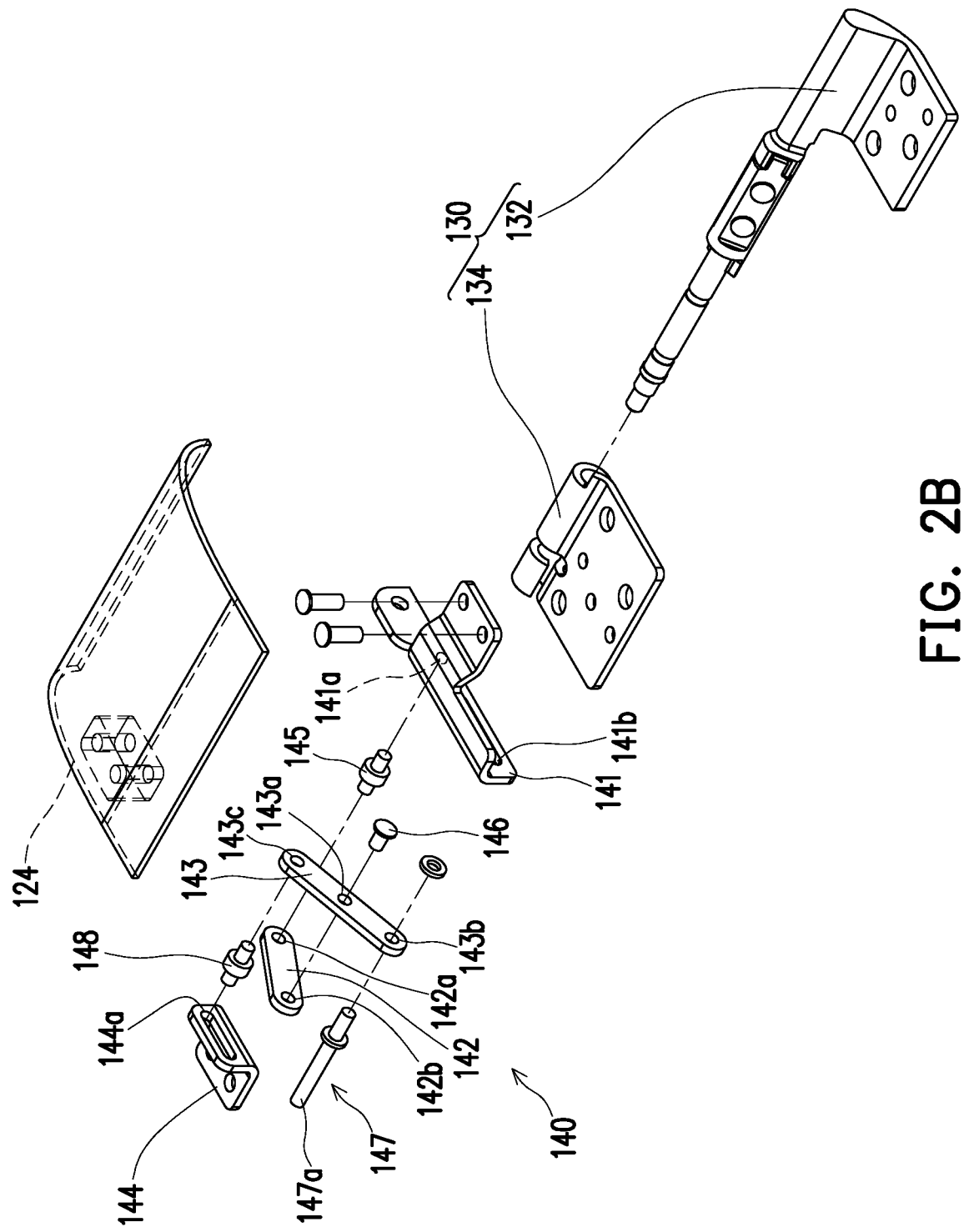
FIG. 2B is a schematic exploded view of the electronic device of FIG. 2A.

FIG. 1 is a schematic perspective view of an electronic device according to a first embodiment of the present disclosure. FIG. 2A is a schematic partial perspective view of the electronic device of FIG. 1 omitting a part of the components. FIG. 2B is a schematic exploded view of the electronic device of FIG. 2A. For clarity and convenience of explanation, part of the structure of the electronic device 100 is shown by broken lines in FIG. 2A and FIG. 2B. Referring to FIG. 1, FIG. 2A and FIG. 2B, the electronic device 100 of the present embodiment includes a first body 110, a second body 120, a hinge module 130, and a linkage mechanism 140. The electronic device 100 includes but not limited to a notebook computer. The first body 110 is, for example but not limited to, a body of the notebook computer provided with an input module, and the second body 120 is, for example but not limited to, a body of the notebook computer provided with a display screen. In addition, although two hinge modules 130 are illustrated in FIG. 1, the following description will be described with one of the hinge modules 130 for convenience of explanation.

Specifically, the second body 120 includes a main body portion 122 and a back cover 124 movably disposed to the main body portion 122. The second body 120 is pivoted to the first body 110 through the hinge module 130 to pivot relative to the first body 110. The linkage mechanism 140 is disposed inside the second body 120, and connected to the hinge module 130. The back cover 124 of the second body 120 is fixed to the linkage mechanism 140 to move along with the linkage mechanism 140.

Figure 3A:
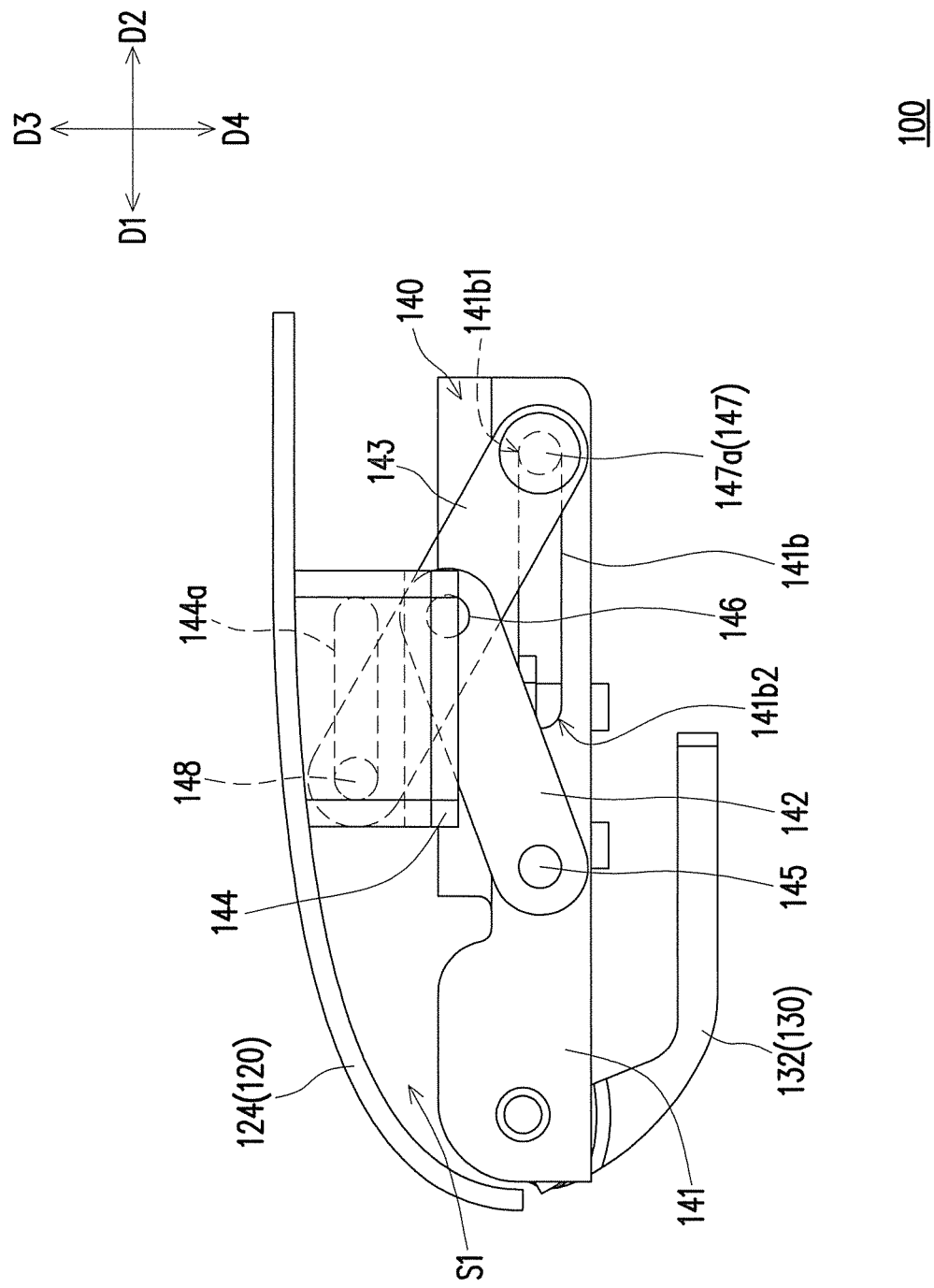
FIG. 3A is a schematic view showing the linkage mechanism of the electronic device of FIG. 2A in a first state.
Figure 3B:
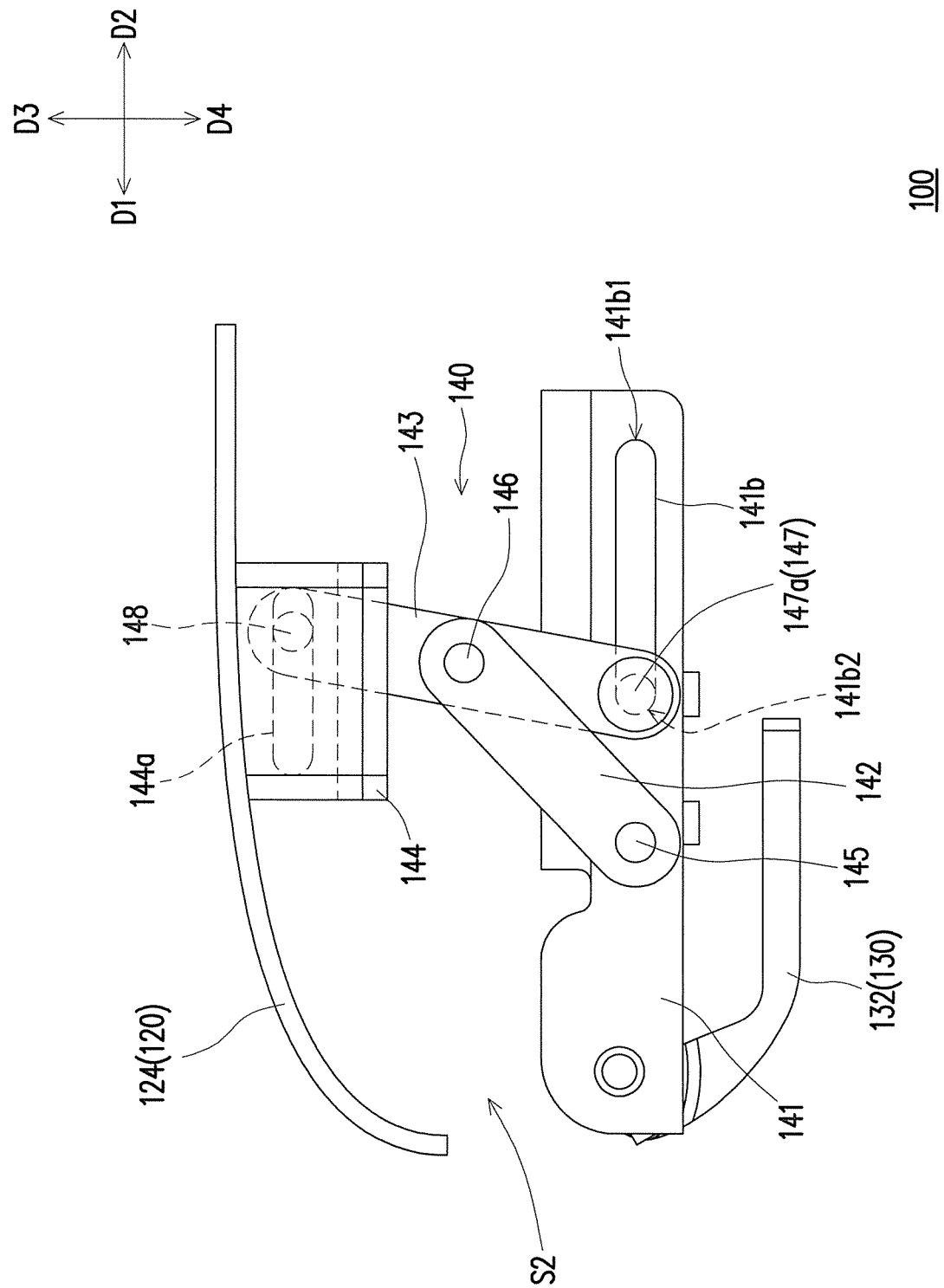
FIG. 3B is a schematic view showing the linkage mechanism of the electronic device of FIG. 3A in a second state.
Figure 3C:
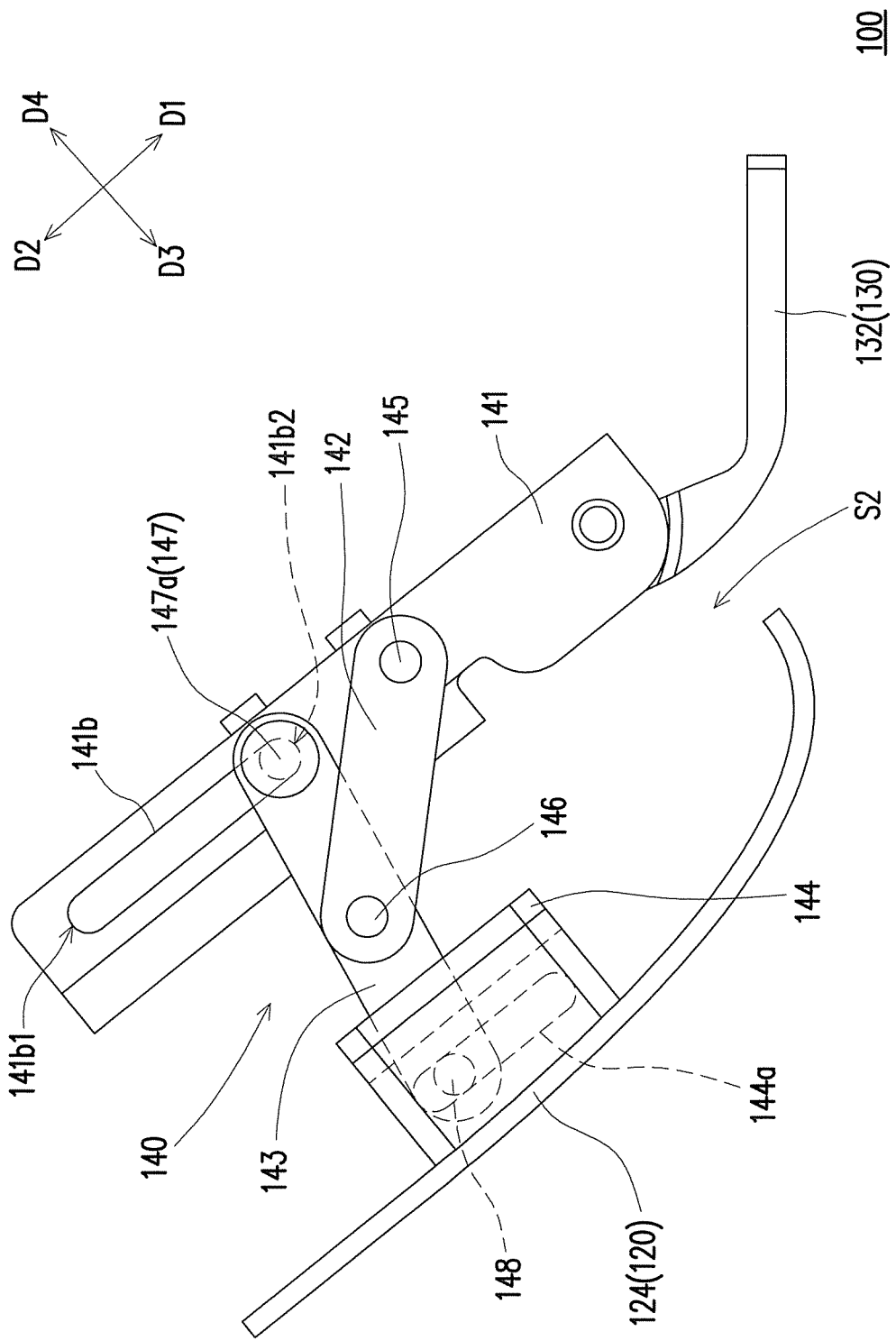
FIG. 3C is a schematic view showing the second bracket of the electronic device of FIG. 3B pivoted relative to the first bracket.

FIG. 3A is a schematic view showing the linkage mechanism of the electronic device of FIG. 2A in a first state. FIG. 3B is a schematic view showing the linkage mechanism of the electronic device of FIG. 3A in a second state. FIG. 3C is a schematic view showing the second bracket of the electronic device of FIG. 3B pivoted relative to the first bracket. For clarity and convenience of explanation, part of the structure of the electronic device 100 is shown by broken lines in FIG. 3A, FIG. 3B, and FIG. 3C. Referring to FIG. 1, FIG. 3A, FIG. 3B and FIG. 3C, the linkage mechanism 140 illustrated in FIG. 3A is defined as the first state. The linkage mechanism 140 shown in FIG. 3B and FIG. 3C is defined as the second state. The linkage mechanism 140 can switch between the first state and the second state. When the linkage mechanism 140 is in the first state as shown in FIG. 3A, there is a first space S1 between the back cover 124 and the hinge module 130. When the linkage mechanism 140 is in the second state as shown in FIG. 3B and FIG. 3C, there is a second space S2 between the back cover 124 and the hinge module 130. The second space S2 is larger than the first space S1.

With the above configuration, when the linkage mechanism 140 is in the second state, the heat generated inside the electronic device 100 can be discharged from the second space S2, thereby improving the heat dissipation efficiency of the electronic device 100.

Referring to FIG. 1, FIG. 2A, FIG. 2B and FIG. 3A, the hinge module 130 includes a first bracket 132 and a second bracket 134. The first bracket 132 is disposed in the first body 110. The second bracket 134 is disposed in the second body 120, and pivoted to the first bracket 132. In other words, the second body 120 is pivoted to the first body 110 through the hinge module 130.

In this embodiment, the linkage mechanism 140 includes a fixing member 141, a first connecting rod 142, a second connecting rod 143, and a linking member 144. The fixing member 141 is pivoted to the first bracket 132 of the hinge module 130, and is fixed to the second bracket 134 of the hinge module 130. The first connecting rod 142 is pivoted to the fixing member 141. The second connecting rod 143 is slidably disposed to the fixing member 141, and is pivoted to the first connecting rod 142. The linking member 144 is slidably disposed to the second connecting rod 143. The back cover 124 is fixed to the linking member 144 of the linkage mechanism 140.

In detail, the fixing member 141 has a first pivot hole 141a and a first sliding slot 141b. The first connecting rod 142 has a second pivot hole 142a and a third pivot hole 142b, and the second pivot hole 142a and the third pivot hole 142b are respectively located at opposite ends of the first connecting rod 142. The second connecting rod 143 has a fourth pivot hole 143a, a fifth pivot hole 143b and a sixth pivot hole 143c, and the fifth pivot hole 143b and the sixth pivot hole 143c are respectively located at opposite ends of the second connecting rod 143. The linking member 144 has a second sliding slot 144a.

The linkage mechanism 140 further includes a first shaft member 145, a second shaft member 146, a third shaft member 147 and a fourth shaft member 148. The first shaft member 145 is disposed through the first pivot hole 141a of the fixing member 141 and the second pivot hole 142a of the first connecting rod 142 to pivot the first connecting rod 142 to the fixing member 141. The second shaft member 146 is disposed through the third pivot hole 142b of the first connecting rod 142 and the fourth pivot hole 143a of the second connecting rod 143 to pivot the second connecting rod 143 to the first connecting rod 142. The third shaft member 147 is disposed through the fifth pivot hole 143b of the second connecting rod 143 and the first sliding slot 141b of the fixing member 141 such that the second connecting rod 143 is slidably disposed to the fixing member 141. The fourth shaft member 148 is disposed through the sixth pivot hole 143c of the second connecting rod 143 and the second sliding slot 144a of the linking member 144 such that the second connecting rod 143 is slidably disposed to the linking member 144.

Further, the first sliding slot 141b has a first end 141b1 and a second end 141b2 opposite to the first end 141b1. When the linkage mechanism 140 is in the first state shown in FIG. 3A, the third shaft member 147 abuts against the first end 141b1.

Referring to FIG. 1, FIG. 2A, FIG. 3A and FIG. 3B, the third shaft member 147 includes a force receiving portion 147a. The force receiving portion 147a is configured to be exposed outside the second body 120 for the user to contact. When the user applies a force to drive the third shaft member 147 to slide in the first sliding slot 141b in a first direction D1, the fourth shaft member 148 slides simultaneously in the second sliding slot 144a in a second direction D2 opposite to the first direction D1, so that the second connecting rod 143 drives the back cover 124 to move in a third direction D3 perpendicular to the first direction D1. At this time, the linkage mechanism 140 is in the second state shown in FIG. 3B.

In this embodiment, when the second body 120 rotates relative to the first body 110, the state of the linkage mechanism 140 is not affected. For example, when the second body 120 drives the second bracket 134 to pivot relative to the first bracket 132, as shown in FIG. 3C, the linkage mechanism 140 can also remain in the second state.

Referring to FIG. 1, FIG. 2A, FIG. 3B and FIG. 3C, when the linkage mechanism 140 is in the second state, the third shaft member 147 abuts against the second end 141b2 of the first sliding slot 141b. When the user applies a force to the force receiving portion 147a to move the third shaft member 147 in the first sliding slot 141b from the second end 141b2 in the second direction D2 and abuts against the first end 141b1, the linkage mechanism 140 can be restored to the first state.

On the other hand, for the linkage mechanism 140 in the second state, when the back cover 124 is subjected to a force in a fourth direction D4 opposite to the third direction D3, the third shaft member 147 will continue to abut against the second end 141b2 of the first sliding slot 141b, such that the linkage mechanism 140 remains in the second state.

In other words, the user can only switch the linkage mechanism 140 from the second state to the first state through the force receiving portion 147a. If the user wants to press the back cover 124, the linkage mechanism 140 is limited to the second state. In this way, in addition to enabling the electronic device 100 to stably dissipate heat through the second space S2, it is also possible to prevent the back cover 124 from being accidentally touched and thus partially or completely closed, thereby improving reliability.

Figure 4A:
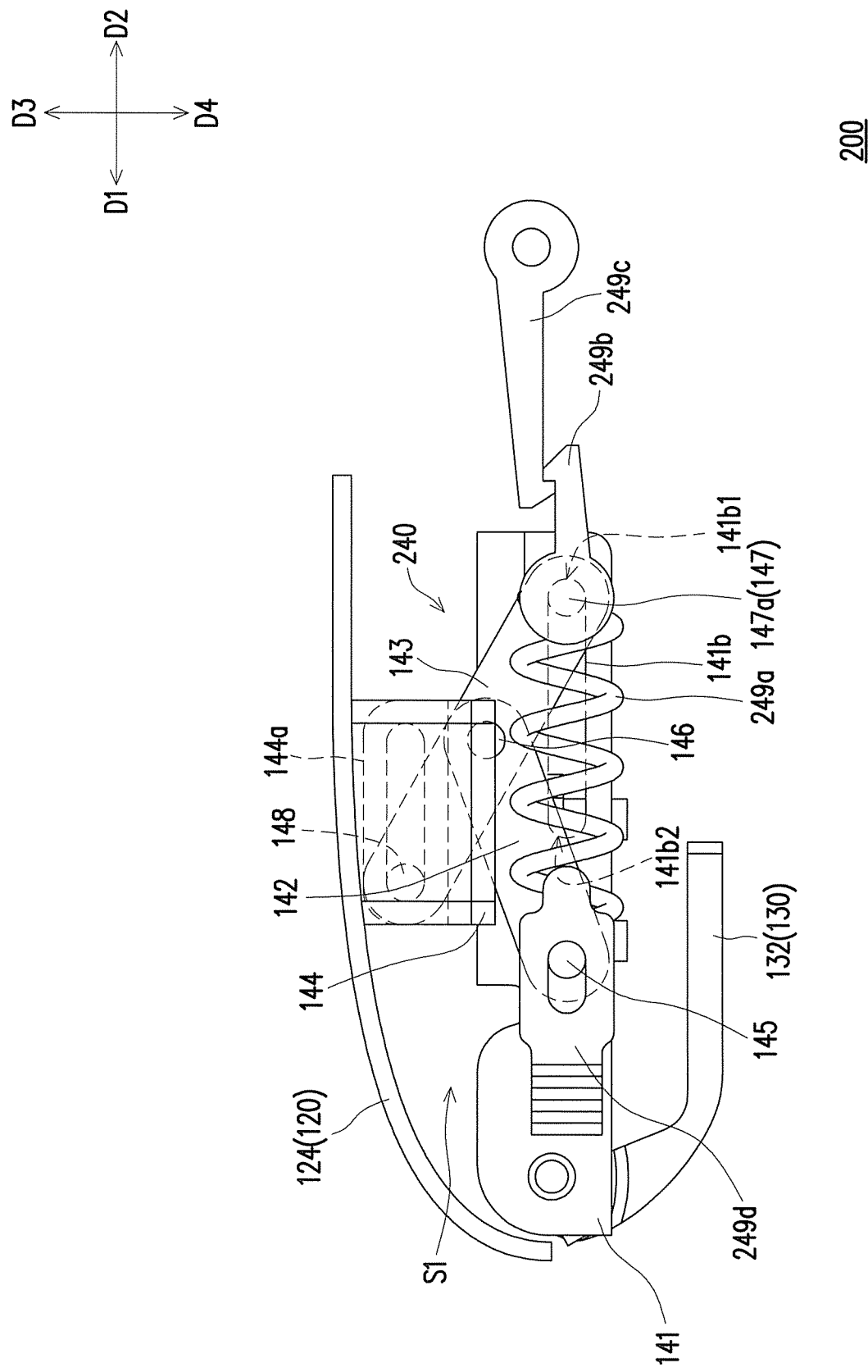
FIG. 4A is a schematic view of an electronic device according to a second embodiment of the present disclosure.
Figure 4B:
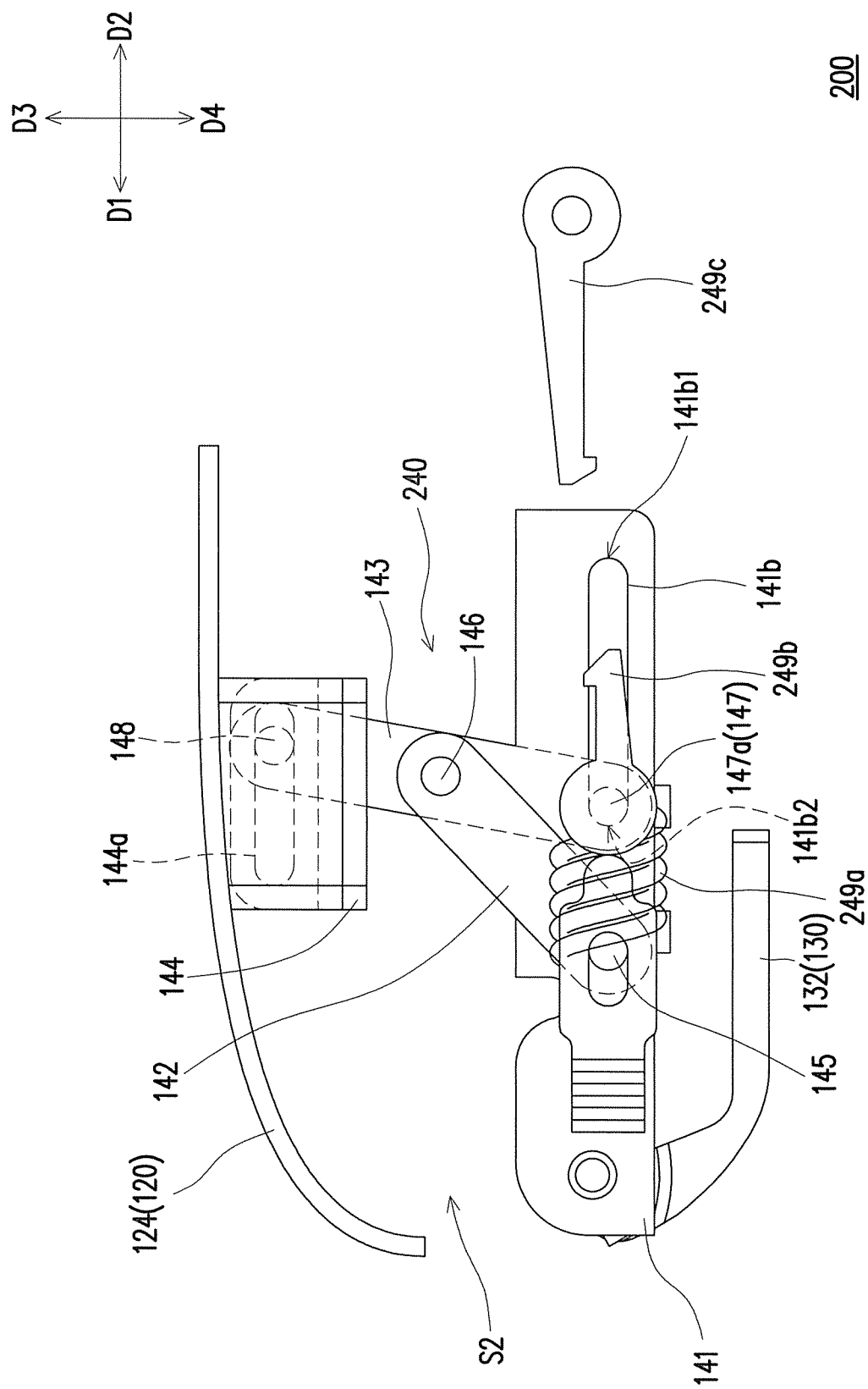
FIG. 4B is a schematic view of the linkage mechanism of the electronic device of FIG. 4A in a second state.
Figure 4C:
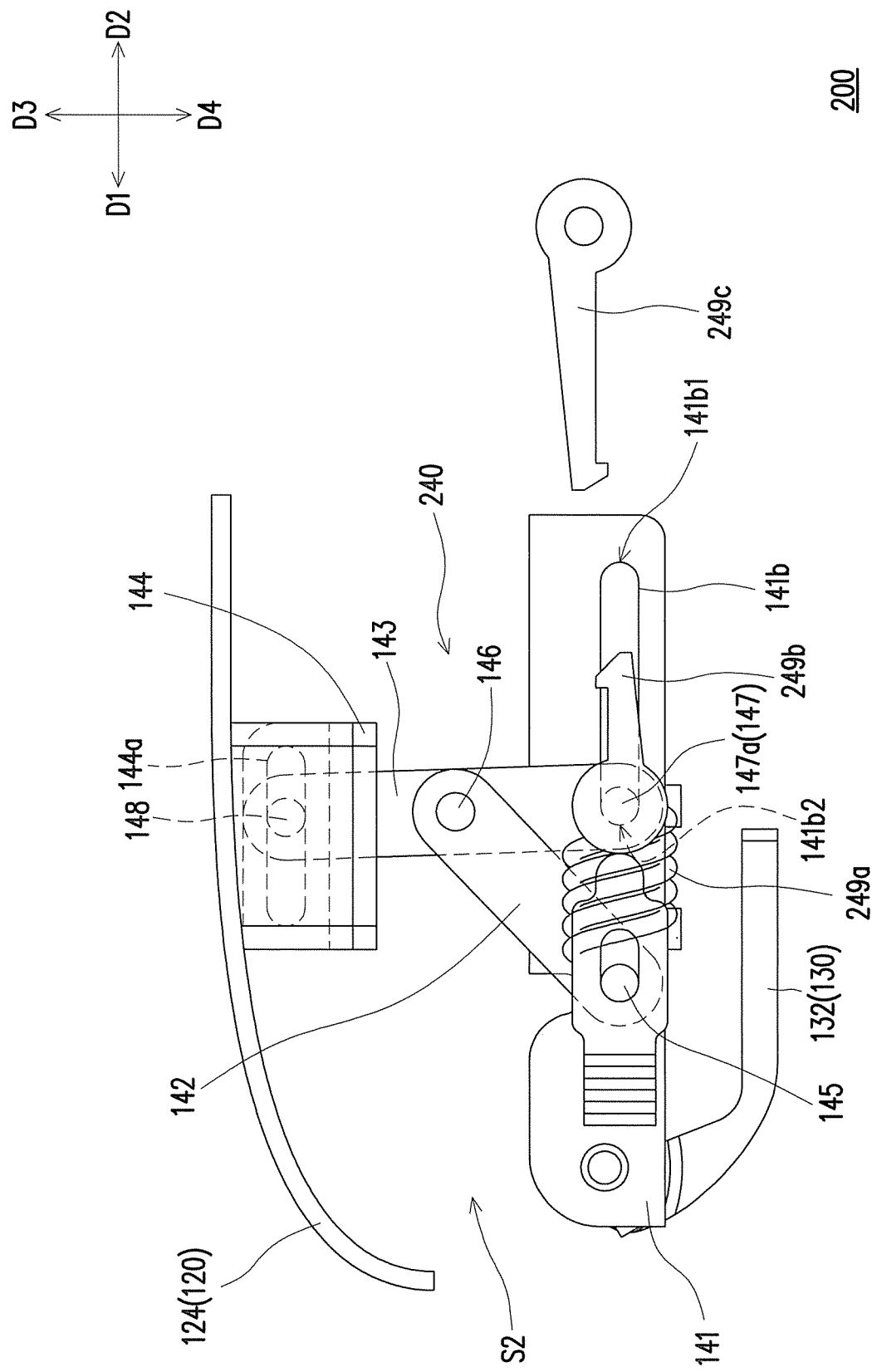
FIG. 4C is a schematic view showing the actuating member of the electronic device of FIG. 4B after being subjected to force.

FIG. 4A is a schematic view of an electronic device according to a second embodiment of the present disclosure. FIG. 4B is a schematic view of the linkage mechanism of the electronic device of FIG. 4A in a second state. FIG. 4C is a schematic view showing the actuating member of the electronic device of FIG. 4B after being subjected to force. For clarity and convenience of explanation, part of the structure of the electronic device 200 is shown by broken lines in FIG. 4A, FIG. 4B, and FIG. 4C. Referring to FIG. 4A, FIG. 4B and FIG. 4C, in the electronic device 200 of FIG. 4A to FIG. 4C, the configuration of the same or similar components is similar to that of the electronic device 100 of FIG. 1 to FIG. 3C, and related details are not described herein again. The difference between the electronic device 200 of FIG. 4A and FIG. 4C and the electronic device 100 of the foregoing embodiment is that the linkage mechanism 240 of the electronic device 200 of the embodiment further includes an elastic member 249a, a first engaging member 249b, and a second engaging member 249c and an actuating member 249d.

The elastic member 249a is, for example, a tension spring disposed between the first shaft member 145 and the third shaft member 147, and configured to pull the third shaft member 147 to move in the first direction D1 to switch the linkage mechanism 240 to the second state. The first engaging member 249b is connected to the third shaft member 147. The second engaging member 249c is configured to engage the first engaging member 249b such that the linkage mechanism 240 is in the first state. The actuating member 249d is slidably disposed to the first shaft member 145.

In other words, when the first engaging member 249b and the second engaging member 249c are engaged with each other, the linkage mechanism 240 is in the first state. When the first engaging member 249b is disengaged from the second engaging member 249c, the elastic member 249a pulls the third shaft member 147 to move in the first direction D1 in the first sliding slot 141b, so that the linkage mechanism 240 automatically switches to the second state shown in FIG. 4B.

On the other hand, the linkage mechanism 240 shown in FIG. 4C is defined as the third state. For the linkage mechanism 240 in the second state, when the back cover 124 is subjected to the force of the fourth direction D4, the third shaft member 147 will continue to abut against the second end 141b2 of the first sliding slot 141b, so that the linkage mechanism 240 continuously remains in the second state.

At this time, the user applies the force to push the actuating member 249d, and after the linkage mechanism 240 is switched from the second state shown in FIG. 4B to the third state shown in FIG. 4C, when the back cover 124 is subjected to the force in the fourth direction D4, the third shaft member 147 slides in the second direction D2 in the first sliding slot 141b, such that the linkage mechanism 240 can be switched from the third state shown in FIG. 4C to the first state shown in FIG. 4A.

In other words, in the electronic device 200 of the embodiment, before the user operates the actuating member 249d, the elastic member 249a continues to pull the third shaft member 147 to slide in the first direction D1, and the linkage mechanism 240 can be positioned in the second state through the elastic member 249a to practically maintain the second space S2 of the back cover 124, thus ensuring heat dissipation of the electronic device 200.

In addition, after the user operates the actuating member 249d to switch the linkage mechanism 240 to the third state, the user can press the back cover 124 to switch the linkage mechanism 240 to the first state, which is quite convenient to use.

Figure 5:
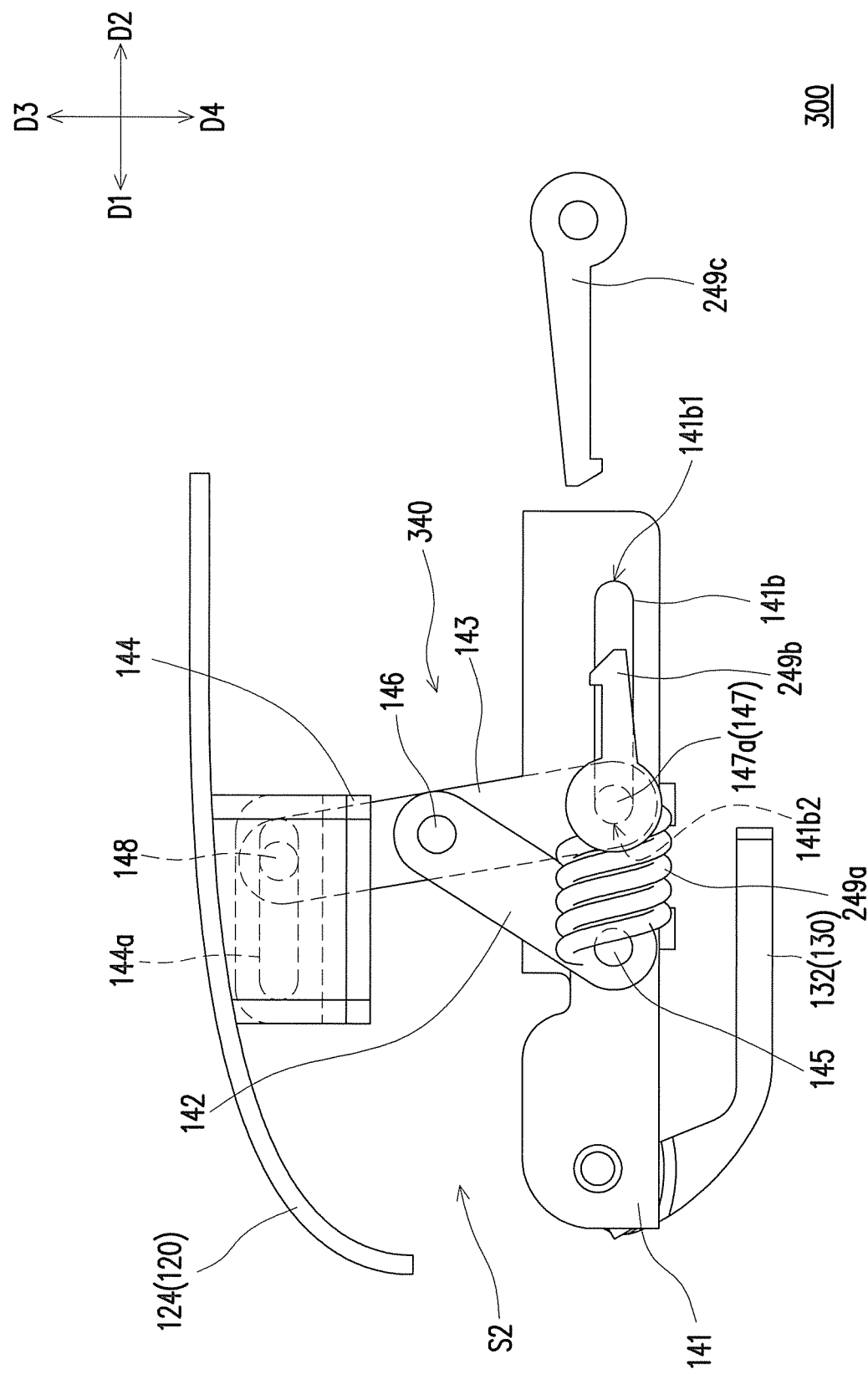
FIG. 5 is a schematic view of an electronic device according to a third embodiment of the present disclosure.

FIG. 5 is a schematic view of an electronic device according to a third embodiment of the present disclosure. For clarity and convenience of explanation, a part of the structure of the electronic device 300 is shown by broken lines in FIG. 5. Referring to FIG. 5, in the electronic device 300 of FIG. 5, the configuration of the same or similar components is similar to that of the electronic device 200 of FIG. 4A to FIG. 4C, and related details are not described herein. The difference between the electronic device 300 of FIG. 5 and the electronic device 200 of the foregoing embodiment is that the linkage mechanism 340 of the electronic device 300 of the present embodiment omits the configuration of the actuating member, and the third shaft member 147 is designed to be able to slide in the second direction D2 in the first sliding slot 141b after being subjected to the force in the fourth direction D4. Therefore, when the linkage mechanism 240 is in the second state (i.e., when the third shaft member 147 abuts against the second end 141b2 of the first sliding slot 141b), after the back cover 124 is subjected to the force in the fourth direction D4, the third shaft member 147 slides in the first sliding slot 141b, so that the linkage mechanism 340 is switched from the second state to the first state.

In summary, in the electronic device of the present disclosure, when the linkage mechanism is in the second state, the heat generated inside the electronic device can be discharged from the second space, thereby improving heat dissipation efficiency of the electronic device.

Although the present disclosure has been disclosed in the above embodiments, it is not intended to limit the present disclosure, and those skilled in the art can make some modifications and refinements without departing from the spirit and scope of the disclosure. Therefore, the scope to be protected by the present disclosure is subject to the scope defined by the appended claims.

What is claimed is:

1. An electronic device, comprising:
   a first body;
   a second body, comprising a main body portion and a back cover movably disposed to the main body portion;
   a hinge module, pivoted between the first body and the second body; and
   a linkage mechanism, disposed in the second body, and connected to the hinge module, wherein the linkage mechanism is slidably pivoted to the back cover,
   wherein the linkage mechanism is changed between a first state and a second state, when the linkage mechanism is in the first state, there is a first space between the back cover and the hinge module, when the linkage mechanism is in the second state, there is a second space between the back cover and the hinge module, and the second space is larger than the first space.

2. The electronic device of claim 1, wherein the linkage mechanism comprises:
   a fixing member, connected to the hinge module;
   a first connecting rod, pivoted to the fixing member;
   a second connecting rod, slidably disposed to the fixing member, and pivoted to the first connecting rod; and
   a linking member, slidably disposed to the second connecting rod, and the back cover is fixed to the linking member.

3. The electronic device of claim 2, wherein the fixing member has a first pivot hole and a first sliding slot, the first connecting rod has a second pivot hole and a third pivot hole, and the second pivot hole and the third pivot hole are respectively located at opposite ends of the first connecting rod, the second connecting rod has a fourth pivot hole, a fifth pivot hole and a sixth pivot hole, the fifth pivot hole and the sixth pivot hole are respectively located at opposite ends of the second connecting rod, and the fourth pivot hole is located between the fifth pivot hole and the sixth pivot hole, and the linking member has a second sliding slot, the linkage mechanism further comprises:
   a first shaft member, disposed through the first pivot hole and the second pivot hole to pivot the first connecting rod to the fixing member;
   a second shaft member, disposed through the third pivot hole and the fourth pivot hole to pivot the second connecting rod to the first connecting rod;
   a third shaft member, disposed through the fifth pivot hole and the first sliding slot such that the second connecting rod is slidably disposed to the fixing member; and
   a fourth shaft member, disposed through the sixth pivot hole and the second sliding slot such that the second connecting rod is slidably disposed to the linking member.

4. The electronic device of claim 3, wherein the first sliding slot has a first end and a second end opposite the first end, when the linkage mechanism is in the first state, the third shaft member abuts against the first end, and when the linkage mechanism is in the second state, the third shaft member abuts against the second end.

5. The electronic device of claim 4, wherein the third shaft member comprises a force receiving portion adapted to be subjected to force to drive the third shaft member to slide in the first sliding slot in a first direction, and adapted to drive the fourth shaft member to slide in a second direction opposite to the first direction in the second sliding slot, such that the second connecting rod drives the back cover to move in a third direction perpendicular to the first direction.

6. The electronic device of claim 5, wherein the linkage mechanism is in the second state, when the back cover is subjected to a force in a fourth direction opposite to the third direction, the third shaft member abuts against the second end to bring the linkage mechanism into the second state.

7. The electronic device of claim 5, wherein the linkage mechanism further comprises:
   an elastic member, disposed between the first shaft member and the third shaft member, and configured to pull the third shaft member to move in the first direction to switch the linkage mechanism to the second state;
   a first engaging member, connected to the third shaft member; and
   a second engaging member, configured to engage the first engaging member to bring the linkage mechanism into the first state.

8. The electronic device of claim 7, wherein the linkage mechanism is in the second state, when the back cover is subjected to a force in a fourth direction opposite to the third direction, the third shaft member abuts against the second end to bring the linkage mechanism into the second state, the linkage mechanism further comprises:
   an actuating member, slidably disposed to the first shaft member, and configured to switch the linkage mechanism to a third state, wherein when the back cover is subjected to the force in the fourth direction, the third shaft member slides in the first sliding slot to switch the linkage mechanism from the third state to the first state.

9. The electronic device of claim 7, wherein the linkage mechanism is in the second state, when the back cover is subjected to a force in a fourth direction opposite to the third direction, the third shaft member slides in the first sliding slot to switch the linkage mechanism from the second state to the first state.

10. The electronic device of claim 1, wherein the hinge module comprises:
    a first bracket, fixed to the first body;
    a second bracket, fixed to the second body and pivoted to the first bracket to pivot the second body to the first body.

* * * * *